(12) United States Patent
Uzelac

(10) Patent No.: US 6,834,355 B2
(45) Date of Patent: Dec. 21, 2004

(54) CIRCUIT IN WHICH THE TIME DELAY OF AN INPUT CLOCK SIGNAL IS DEPENDENT ONLY ON ITS LOGIC PHASE WIDTH AND A RATIO OF CAPACITANCES

(75) Inventor: Lawrence S. Uzelac, Auburn, CA (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 09/738,695

(22) Filed: Dec. 15, 2000

(65) Prior Publication Data

US 2002/0112194 A1 Aug. 15, 2002

(51) Int. Cl.[7] ............................................. G06F 1/04
(52) U.S. Cl. ....................................... 713/401; 713/400
(58) Field of Search ............................... 713/400, 401, 713/500; 327/227, 172, 100

(56) References Cited

U.S. PATENT DOCUMENTS

| | | | | |
|---|---|---|---|---|
| 5,578,952 A | * | 11/1996 | Shoji | ........................ 327/172 |
| 5,920,219 A | * | 7/1999 | Young et al. | ............... 327/227 |

\* cited by examiner

Primary Examiner—Thomas Lee
Assistant Examiner—Pranav Chandrasekhar
(74) Attorney, Agent, or Firm—Blakely, Sokoloff, Taylor & Zafman LLP

(57) ABSTRACT

The invention provides, in an embodiment, a structure, method and means for generating clock phases, synchronized to the system clock, that to first order are independent of process parameters including drive current, parasitic resistance and parasitic capacitance. In one aspect, an apparatus is provided to generate an output phase at a predetermined time relative to an input clock signal and dependent on a logic phase width of the input clock signal. In another aspect, the apparatus includes similar circuit components with unequal units, the predetermined time is further dependent on the units ratio of the similar circuit components. In another aspect, the apparatus is cascaded with at least one reproduction of the apparatus, and configured to provide a multiple of the input clock signal. In another aspect, the apparatus is coupled in parallel with at least one reproduction of the apparatus, and configured to provide at least two output phases generated in parallel during the input clock signal.

21 Claims, 5 Drawing Sheets and routed to the embedded block. Other schemes for generating synchronous clock phases and clock multiplication are utilized, including load modulated inverter delay chains and delay locked loops (DLL).

CIRCUIT IN WHICH THE TIME DELAY OF AN INPUT CLOCK SIGNAL IS DEPENDENT ONLY ON ITS LOGIC PHASE WIDTH AND A RATIO OF CAPACITANCES

FIELD

This invention relates to generating clock phases, more particularly, generating clock phases at a predetermined time, synchronized to a system clock, that to first order are independent of process parameters including drive current, parasitic resistance and parasitic capacitance, and only relative to the system clock and dependent on the system clock logic phase width and the units ratio of capacitance values.

BACKGROUND

Internal and external functional timings of embedded circuit blocks used within chipset products are characterized as needed for new silicon process technologies. Many of such timings are used in embedded memory circuit blocks. In an effort to mitigate process dependence of internal and external functional timings, "clocked" functions are being utilized in place of "self-timed" functions. However, when converting self-timed functions to clocked functions within embedded circuit blocks, providing a clock signal that is a multiple value of the system clock with adequate timing margin adds complexity. For example, a circuit may simply require a single clock phase delayed from the system clock by a fixed amount of time, or may require a multiplied clock signal. Typically, such a signal is provided by a self-timed "delay chain". A delayed phase may also be generated by a higher order clock signal from a phase locked loop (PLL), and routed to the embedded block. Other schemes for generating synchronous clock phases and clock multiplication are utilized, including load modulated inverter delay chains and delay locked loops (DLL).

BRIEF DESCRIPTION OF THE DRAWINGS

Additional advantages of the invention will become apparent upon reading the following detailed description and upon reference to the drawings, in which.

DETAILED DESCRIPTION

Figure 1:
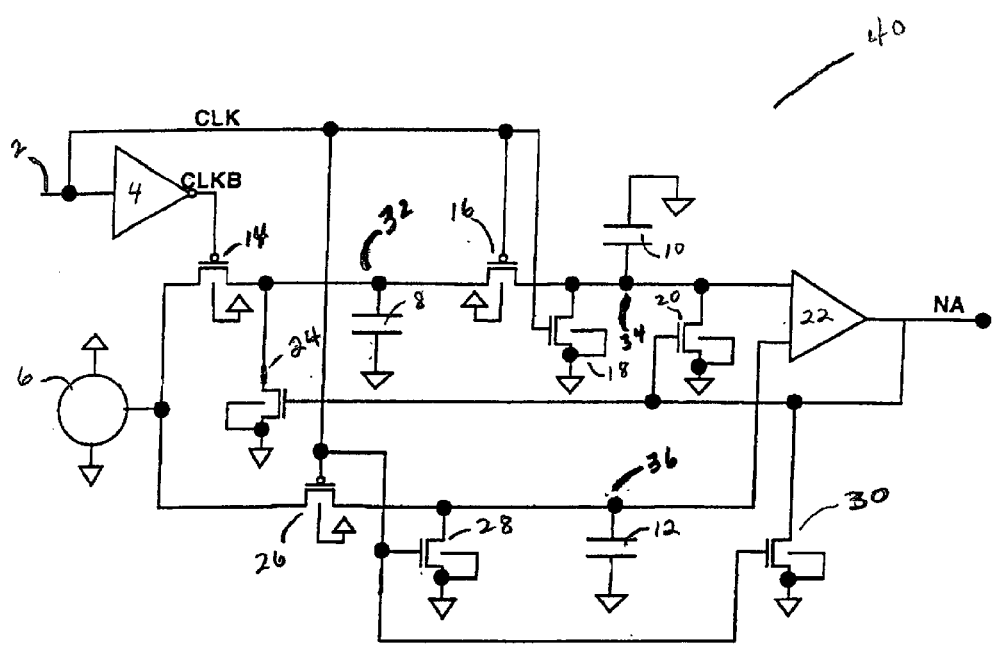
FIG. 1 is circuit schematic showing an embodiment of the present invention.

Exemplary embodiments are described with reference to specific configurations. Those skilled in the art will appreciate that various changes and modifications can be made while remaining within the scope of the claims.

The techniques currently used to modify self timed functions in the memory block to clocked functions, and providing a clock signal that is a multiple value of the system clock with adequate margin are fraught with limitations. For example, delay chains create a delay that is highly dependent on process, voltage and temperature variations. Further, in using a PLL, if routing distance is significant, then clock skew may be introduced that is difficult to characterize since it is dependent on process parameters and routing technique.

In an embodiment, the present invention enables an embedded circuit block to provide clock phases for an internal timing control that are synchronized to a system clock. In an embodiment, the invention mitigates process dependence of internal and external functional timings by modifying the "self timed" functions in the memory block to "clocked" functions. For example, in an embodiment, by clocking a memory bitline precharge pulse width rather than using self-timed inverter delay chains, circuit functionality and robustness can be insured over a wide range of process technologies with little circuit modification. Such circuit design enhances circuit re-use across product lines and technologies.

In an embodiment, the invention is used by chipset embedded circuits requiring a local clock signal having a higher multiple than a system clock, including an input/output controller hub (ICH), memory controller hub (MCH), etc. In an embodiment, the invention is utilized directly in the embedded circuit block, similar to self-timed circuit elements. The need to route a higher-frequency clock signal from a PLL is eliminated, while maintaining the process independent behavior of the generated clock phases, similar to a PLL. In an embodiment, the invention can be used, for example, when PLL generated clock multiple signals are not readily available or are costly to produce. Further, while frequency multiplication can be done using a PLL, in an embodiment, the invention is smaller and consumes less power than a PLL and associated clock tree to distribute a signal. In an embodiment, the invention size allows it to be placed in an embedded circuit block directly where it is needed, rather than consuming power by routing a clock signal from a PLL. In an embodiment, the invention provides a benefit for mobile applications by allowing it to be "locked" within one clock phase of activation, whereas a PLL requires several microseconds to "lock." In an embodiment, the invention provides a further advantage, not available with a PLL, in that it can be turned on within one clock phase of being needed and remain in an off state when not needed, thereby saving power.

In an embodiment, the invention provides a structure, method and means for generating clock phases, synchronized to the system clock, that to first order are independent of process parameters including transistor drive current, parasitic resistance, and parasitic capacitance. In an embodiment of the invention, a circuit is provided that receives an input clock signal and generates an output phase, output transition, or output event at a predetermined time that is relative to the input clock signal and dependent on a logic phase width of the input clock signal. In an embodiment, the predetermined time is relative to at least one rising edge of the input clock signal and a falling edge of the input clock signal.

In an embodiment, the invention includes a circuit having similar circuit components and dissimilar circuit components. By similar circuit components, it is meant, for example, two capacitors. By dissimilar circuit components, it is meant, for example, one resistor and one capacitor. In an embodiment, at least two of the similar circuit components have unequal unit values, and the predetermined time is further dependent on the units ratio of at least two similar circuit components having unequal unit values. In an embodiment, the invention is included as part of an embedded circuit block, as part of a chipset.

In an embodiment of the invention, an apparatus is provided having a circuit. The circuit, as shown in FIG. 1, generates clock phases that to first order, are independent of the absolute value of process parameters such as transistor drive current, parasitic resistance, and parasitic capacitance. Current source 6 provides current to transistor 14 and transistor 26. An incoming clock signal (CLK) is received by input 2. Inverter 4 inverts the CLK signal indicated as CLKB. The incoming CLK signal is either a logic high ("high") or a logic low ("low") at any given time. During a "high" phase of the CLK signal, inverter 4 inverts the "high" CLK signal to a "low" CLKB signal, and causes the input to transistor 14 to be low, turning on transistor 14. Current source 6 sends current through transistor 14 and charges capacitor 8 connected to node 32. Also during the "high" phase of the CLK signal, transistor 16 and transistor 26 are in an "off" non-conducting state, transistor 18 and transistor 28 are in an "on" conducting state, pulling node 34 and node 36 to a ground state (Vss) through transistor 18 and transistor 28, respectively. The voltage that node 32 reaches during the "high" phase of CLK indicated below as ($V_{N1}$ (HighPhase) ) is a function of the current supplied by current source 6, the capacitance of capacitor 8, and width of the high phase of CLK. The voltage of $V_{N1}$(HighPhase) is limited by the power supply voltage. Additionally, the output of comparator 22 (NA) is pulled to Vss through transistor 30, being in an "on" state.

During a "low" phase of the CLK signal, transistor 14 turns off so that current source 6 effectively stops charging capacitor 8. Transistor 16 turns on, transistor 18 turns off, and the voltage across capacitor 8 discharges, charging capacitor 10. Transistor 26 turns on, transistor 28 turns off, and current source 6 charges capacitor 12 connected to node 36. Also, transistor 30 turns off. In the equations shown below, $V_{32}$ indicates the voltage of node 32, $V_{34}$ is the voltage of node 34, $V_{36}$ is the voltage of node 36, $C_8$ is the capacitance of capacitor 8, $C_{10}$ is the capacitance of capacitor 10, $C_{12}$ is the capacitance of capacitor 12, $C_{50}$ is the capacitance of capacitor 50, $C_{54}$ is the capacitance of capacitor 54, $C_{58}$ is the capacitance of capacitor 58, $C_{62}$ is the capacitance of capacitor 62, and $C_{70}$ is the capacitance of capacitor 70.

The voltage on node 34 rises and the voltage on node 32 falls to the value of:

$$V_{32} = V_{34} = V_{32}(HighPhase) \times \left(\frac{C_8}{C_8 + C_{10}}\right)$$

with $V_{32}$(HighPhase)=Maximum Voltage achieved during the high phase of clock $$V_{32}(HighPhase) = \frac{I \times T_{high}}{C_8}$$

with $T_{high}$=the time (width) of the high phase of the clock CLK.

I=constant current from current source 6

Also during the "low" phase of the CLK signal, the voltage on node 36 rises as a function of I and the capacitance capacitor 12, according to the relation:

$$V_{36} = \frac{I \times t}{C_{12}}$$

with t=time from the falling edge defining the start of the low phase of CLK.

Node 34 and node 36 are connected to the differential inputs of high-speed comparator 22. In an alternative embodiment, comparator 22 is replaced by other apparatus or methods of comparing the voltage of node 34 and node 36. The output of high-speed comparator 22 transitions when the voltage on node 36 exceeds the voltage on node 34. The time delay from the falling edge of the "low" phase of CLK at which this occurs can be calculated by setting these voltages equal:

$$V_{36} = V_{34}$$

$$\frac{I \times t}{C_{12}} = \frac{I \times T_{high}}{C_8} \times \left(\frac{C_8}{C_8 + C_{10}}\right)$$

The time delay (phase shift) from the falling edge of CLK to the Generated Pulse is then:

$$t = T_{high}\left(\frac{C_{12}}{C_8 + C_{10}}\right)$$

In this analysis, the value of t is independent of the absolute value of the charging current or capacitance, and is only dependent on the width of the "high" system clock phase and the ratio of the capacitance values. Note if $C_8 = C_{10} = C_{12}$ then:

$$t = \frac{T_{high}}{2}$$

Figure 2:
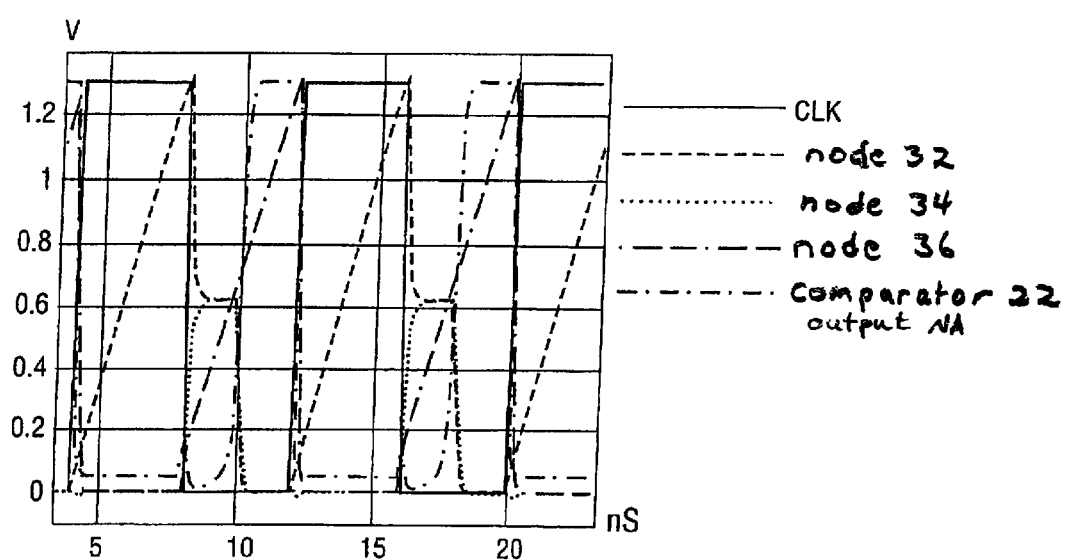
FIG. 2 is a simulation of time versus voltage of the circuit depicted in FIG. 1, showing the CLK input, circuit node 32, node 34, node 36 and comparator 22 output NA in an embodiment of the present invention.

Simulated waveforms of the voltages of node CLK, node 32, node 34, node 36, and the output of comparator 22 (NA) are shown in FIG. 2, using a 66 megahertz (MHz) clock signal. The axis of ordinates is shown in Voltage (V), and the axis of abscissa is shown in nanoseconds (nS).

Figure 3:
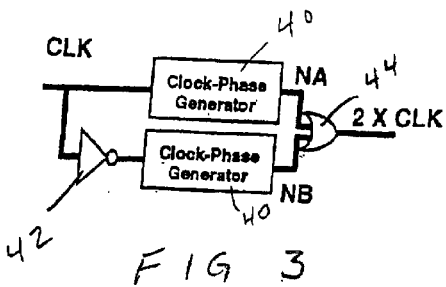
FIG. 3 is a block diagram depicting the invention, connected with a reproduction of the invention, being utilized to generate two clock phases for every one input clock phase, in an embodiment of the present invention.
Figure 4:
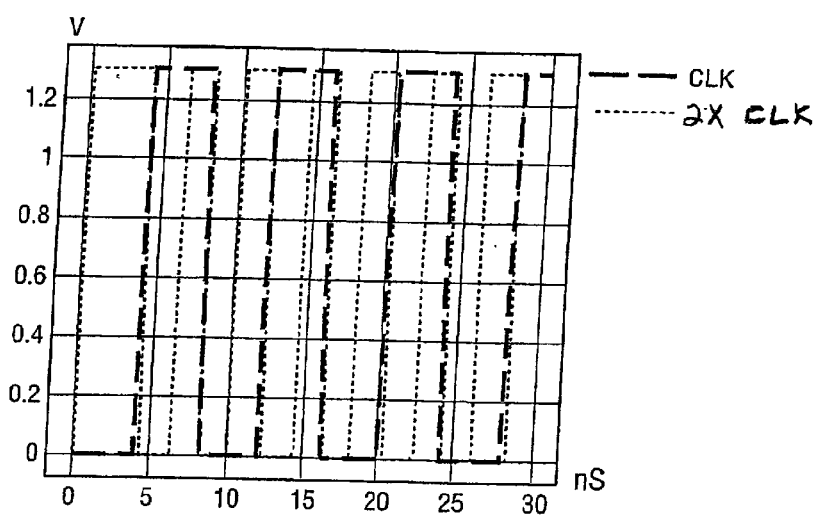
FIG. 4 is a simulation of time versus voltage of the circuit depicted in FIG. 3, showing the clock input and a phase output, in an embodiment of the present invention.

In an embodiment, as shown in FIG. 3, a second multiple (2×) of the incoming clock signal frequency is provided using two separate clock phase generators 40, with $C_8=C_{10}=C_{12}$. This is accomplished by inverting CLK, using inverter 42. The output of the inverted clock is shown as NB. A 2×multiple of the incoming clock frequency is generated by coupling logic "OR" function 44 to the voltage signals NA and NB. The schematic of the incoming clock signal (CLK) and the 2×multiplied signal (2×CLK) produced is shown in FIG. 4. The axis of ordinates is shown in Voltage (V), and the axis of abscissa is shown in nanoseconds (nS).

Figure 5:
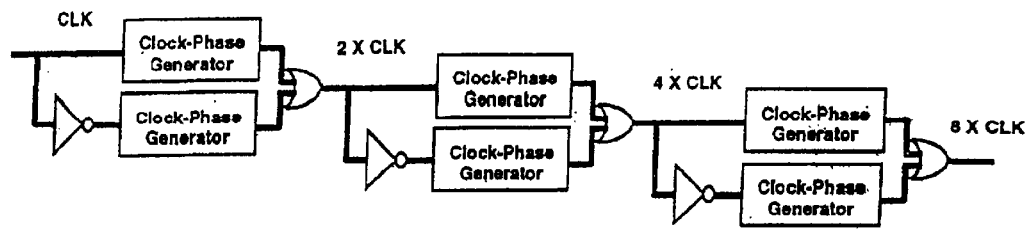
FIG. 5 is a block diagram depicting a cascaded embodiment of the FIG. 3 embodiment of the invention.
Figure 6:
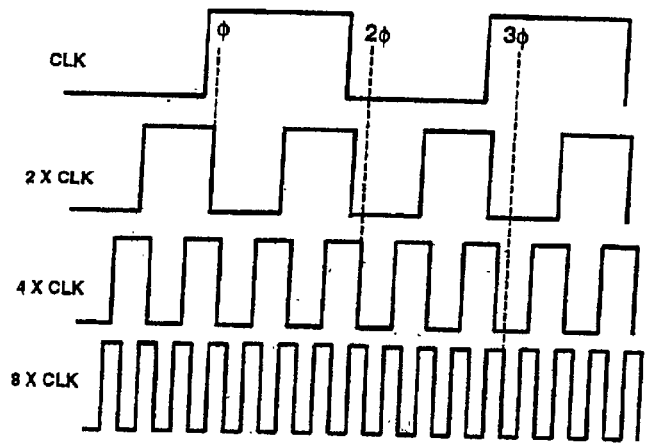
FIG. 6 is a timing diagram showing the clock input and various phase outputs of the invention as in FIG. 5, in an embodiment of the present invention.

In an embodiment, higher order frequency multiplication can be performed by cascading the 2×frequency multiplier to generate 4×, 8×, and etc multiplication, as shown in FIG. 5. A schematic of CLK, 2×CLK, 4×CLK and 8×CLK is shown in FIG. 6. A cumulative phase shift is introduced, shown as φ, 2φ, and 3φ, with each multiplication stage due to an intrinsic delay of the clock-phase generator stage itself. This may or may not be an issue to a given circuit application.

Figure 7:
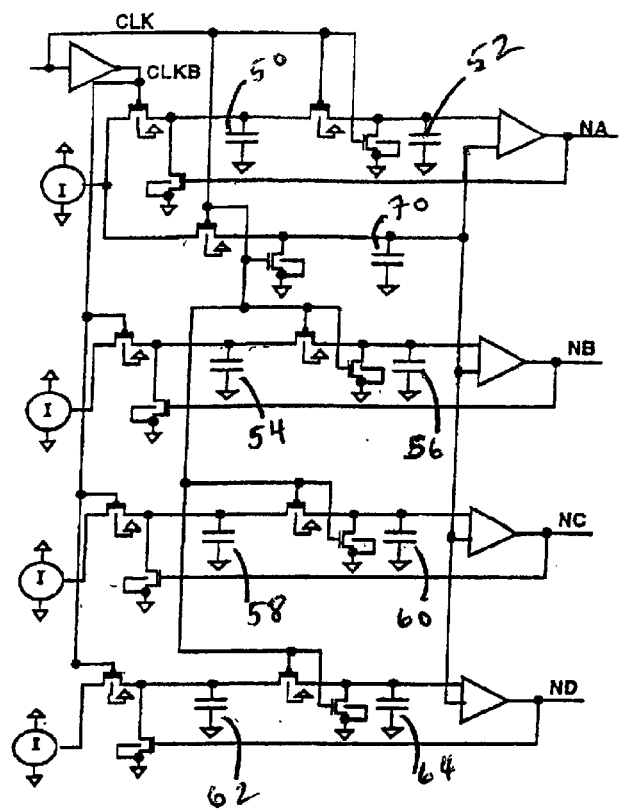
FIG. 7 is a block diagram depicting the invention connected in parallel with reproductions of the invention, in an embodiment of the present invention.

In an embodiment, another method of frequency multiplication using clock phase generator 40 is illustrated in FIG. 7. In this embodiment, the clock pulses represented as NA, NB, NC and ND are generated in parallel during the same phase of the incoming CLK. The relationship between the incoming clock phase and the generated clock phases is a function the width of the incoming clock phase and a ratio of the unit value of the capacitors. In this embodiment, the unit value of capacitor 50 is equal to the unit value of capacitor 52, the unit value of capacitor 54 is equal to the unit value of capacitor 56, the unit value of capacitor 58 is equal to the unit value of capacitor 60, and the unit value of capacitor 62 is equal to the unit value of capacitor 64.

Referring to FIG. 7:

$$TA = T_{high} \times \left(\frac{C_{70}}{2 \times C_{50}}\right)$$

$$TB = T_{high} \times \left(\frac{C_{70}}{2 \times C_{54}}\right)$$

$$TC = T_{high} \times \left(\frac{C_{70}}{2 \times C_{58}}\right)$$

$$TD = T_{high} \times \left(\frac{C_{70}}{2 \times C_{62}}\right)$$

Figure 8:
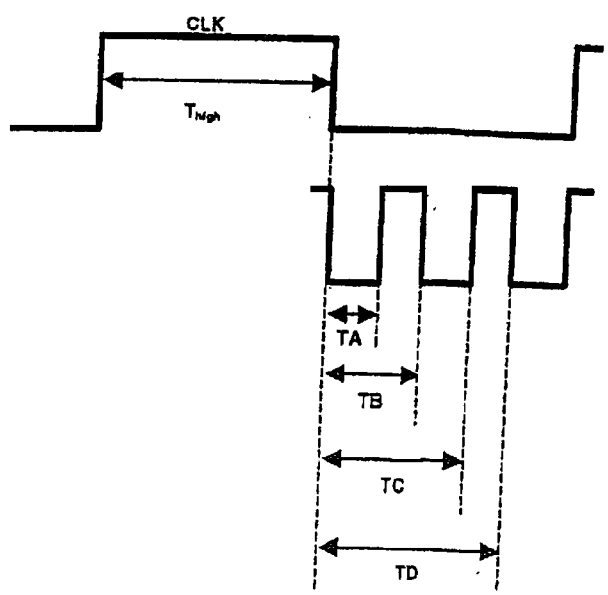
FIG. 8 is a timing diagram showing the clock input and various phase outputs of the invention as in FIG. 7, in an embodiment of the present invention.

As shown in FIG. 8, this embodiment provides higher order frequency multiplication without the cumulative associated phase shift effect of the cascade multiplication embodiment.

Having disclosed exemplary embodiments, modifications and variations may be made to the disclosed embodiments while remaining within the spirit and scope of the invention as defined by the appended claims.

What is claimed is:

1. An apparatus comprising:
    a circuit configured to receive an input clock signal and to generate an output phase synchronized to said input clock signal at a predetermined time delayed relative to said input clock signal, wherein the predetermined time is dependent on a logic phase width of said input clock signal and on a ratio of capacitance values and is indenendent of at least one of the process parameters including transistor drive current, parasitic resistance, and parasitic capacitance.

2. The apparatus as in claim 1, wherein said predetermined time is relative to at least one of a rising edge of said input clock signal, and a falling edge of said input clock signal.

3. The apparatus as in claim 1, wherein said circuit is further configured to provide a first signal and a second signal, compare said first signal and said second signal, and generate said output phase dependent on said comparison of said first signal and said second signal.

4. The apparatus as in claim 3, wherein said comparison is provided by a comparator.

5. The apparatus as in claim 1, wherein said apparatus is cascaded with at least one reproduction of said apparatus, and configured to provide a multiple of said input clock signal.

6. The apparatus as in claim 1, wherein said apparatus is coupled in parallel with at least one reproduction of said apparatus, and configured to provide at least two of said output phase generated in parallel during said input clock signal.

7. A method comprising:
    receiving an input clock signal and generating an output phase synchronized to said input clock signal at a predetermined time delayed relative to said input clock signal, wherein the predetermined time is dependent on a logic phase width of said input clock signal and on a ratio of capacitance values and is independent of at least one of the process parameters including transistor drive current, parasitic resistance, and parasitic capacitance.

8. The method as in claim 7, wherein said predetermined time is relative to at least one of a rising edge of said input clock signal, and a falling edge of said input clock signal.

9. The method as in claim 7, further comprising providing a first signal and a second signal, comparing said first signal and said second signal, and generating said output phase dependent on said comparison of said first signal and said second signal.

10. The method as in claim 7, further providing a multiple of said input clock signal.

11. A chipset comprising:
    an embedded circuit block including a circuit configured to receive an input clock signal and to generate an output phase synchronized to said input clock signal at a predetermined time delayed relative to said input clock signal, wherein the predetermined time is dependent on a logic phase width of said input clock signal and on a ratio of capacitance values and is independent of at least one of the process parameters including transistor drive current, parasitic resistance, and parasitic capacitance.

12. The chipset as in claim 11, wherein said predetermined time is relative to at least one of a rising edge of said input clock signal, and a falling edge of said input clock signal.

13. The chipset as in claim 11, wherein said circuit is further configured to provide a first signal and a second signal, compare said first signal and said second signal, and generate said output phase dependent on said comparison of said first signal and said second signal.

14. The chipset as in claim 13, wherein said comparison is provided by a comparator.

15. The chipset as in claim 11, wherein said apparatus is cascaded with at least one reproduction of said apparatus, and configured to provide a multiple of said input clock signal.

16. The chipset as in claim 11, wherein said apparatus is coupled in parallel with at least one reproduction of said apparatus, and configured to provide at least two of said output phase generated in parallel during said input clock signal.

17. A chipset comprising:
    an embedded circuit block including means for receiving an input clock signal and generating an output phase synchronized to said input clock signal at a predetermined time delayed relative to said input clock signal, wherein the predetermined time is dependent on a logic phase width of said input clock signal and on a ratio of capacitance values and is independent of at least one of the process parameters including transistor drive current, parasitic resistance, and parasitic capacitance.

18. The chipset as in claim 17, wherein said predetermined time is relative to at least one of a rising edge of said input clock signal, and a falling edge of said input clock signal.

19. The chipset as in claim 17, wherein said embedded circuit block further comprising means for providing a first signal and a second signal, comparing said first signal and said second signal, and generating said output phase dependent on said comparison of said first signal and said second signal.

20. The chipset as in claim 17, said embedded circuit block further comprising means for providing a multiple of said input clock signal.

21. The chipset as in claim 17, said embedded circuit block further comprising means for providing at least two of said output phase generated in parallel during said input clock signal.

* * * * *